United States Patent
Chang et al.

(10) Patent No.: US 9,087,492 B2
(45) Date of Patent: Jul. 21, 2015

(54) BUS-LINE ARRANGEMENT IN A GATE DRIVER

(75) Inventors: Chun Huan Chang, Hsinchu (TW);
 Chun-Hsin Liu, Hsinchu (TW);
 Kun-Yueh Lin, Hsinchu (TW); Ya-Ting Lin, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 709 days.

(21) Appl. No.: 13/453,581

(22) Filed: Apr. 23, 2012

(65) Prior Publication Data

US 2013/0278567 A1 Oct. 24, 2013

(51) Int. Cl.
 *G06F 3/038* (2013.01)
 *G09G 3/36* (2006.01)
 *G06F 17/50* (2006.01)
 *G06F 1/10* (2006.01)

(52) U.S. Cl.
 CPC ............... *G09G 3/3677* (2013.01); *G06F 1/10* (2013.01); *G06F 17/5077* (2013.01); *G09G 2300/0426* (2013.01); *G09G 2310/0205* (2013.01)

(58) Field of Classification Search
 CPC .................... G09G 3/3677; G09G 2300/0426; G09G 2310/0205; G06F 1/10; G06F 17/5077
 USPC ...................... 345/98–100, 204; 349/139, 149
 See application file for complete search history.

(56) References Cited

U.S. PATENT DOCUMENTS

| | | | |
|---|---|---|---|
| 8,446,555 B2 * | 5/2013 | Jung | 349/149 |
| 2002/0050964 A1 | 5/2002 | Karube et al. | |
| 2011/0148830 A1 | 6/2011 | Hsu et al. | |
| 2012/0139881 A1 * | 6/2012 | Kwon et al. | 345/204 |
| 2012/0235713 A1 * | 9/2012 | Mori | 327/109 |
| 2012/0313905 A1 * | 12/2012 | Kang et al. | 345/204 |

FOREIGN PATENT DOCUMENTS

| | | |
|---|---|---|
| CN | 201868071 | 6/2011 |
| TW | 546504 | 8/2003 |
| TW | 201123149 | 7/2011 |

OTHER PUBLICATIONS

Chinese Office Action dated Aug. 26, 2014 in corresponding CN patent application No. 201310081586.4 (4 pages).
Taiwan Patent Office Search Report dated Mar. 23, 2015 issued in counterpart Taiwanese patent application No. 10420359290 (9 pages).

* cited by examiner

*Primary Examiner* — Rodney Amadiz
(74) *Attorney, Agent, or Firm* — Ware, Fressola, Maguire & Barber, LLP

(57) ABSTRACT

A method for use in a display panel is disclosed. The method includes providing M bus lines in the bus area for receiving a plurality of clock signals, M being a positive integer greater than 3; providing a plurality of signal lines to separately provide the clock signals from the M bus line to the circuit area, the circuit area configured to provide the plurality of sequential gate line signals in response to the clock signals, the plurality of signal lines including a plurality of adjacent signal-line pairs, each adjacent signal-line pair having a resistance difference, said signal lines including a maximum resistance value and a minimum resistance value, and wherein the M bus lines are arranged such that the resistance difference in any one of the adjacent signal-line pairs is smaller than a value difference between the maximum resistance value and the minimum resistance value.

19 Claims, 7 Drawing Sheets

BUS-LINE ARRANGEMENT IN A GATE DRIVER

FIELD OF THE INVENTION

The present invention relates generally to a display panel and, in particular, to a gate-driver for providing gate-line signals to the display panel.

BACKGROUND

A thin-film transistor liquid crystal display (TFT LCD) generally includes an LCD panel and a backlight unit for illumination. To simplify the process of making display panels including the LCD panel, a gate driver circuit for driving the display panel is integrated in the display panel and disposed within the periphery circuit area of the display panel. The gate driver circuit so integrated is known as a gate driver-on-array (GOA) structure. FIG. 1 shows a general layout of a display panel having a GOA structure. As shown in FIG. 1, the display panel 10 comprises a display area 20 and a gate driver 30 to provide gate-line signals to a plurality of gate lines G1, G2, . . . , GN. An external connector 15 is also used to provide clock signals and data signals to the display panel 10. It is common practice to dispose a plurality of electrically conductive lines on a substrate from the gate driver 30 to the display area 20 to provide the gate-line signals, and a plurality of bus lines to receive the clock signals from the external connector 15 and to convey the clock signals to the gate driver 30. The present invention is concerned with the arrangement of the bus lines on the display panel 10.

SUMMARY

One aspect of the present invention is a method, which comprises:
providing M bus lines in the bus area for receiving a plurality of clock signals, M being a positive integer greater than 3;
providing a plurality of signal lines to separately provide the clock signals from the M bus line to the circuit area, the circuit area configured to provide the plurality of sequential gate line signals in response to the clock signals, the plurality of signal lines comprising a plurality of adjacent signal-line pairs, each adjacent signal-line pair having a resistance difference, said signal lines comprising a maximum resistance value and a minimum resistance value, and wherein the M bus lines are arranged such that the resistance difference in any one of the adjacent signal-line pairs is smaller than a value difference between the maximum resistance value and the minimum resistance value.

Another aspect of the present invention is a circuit, which comprises:
a bus area comprising M bus lines configured to receive a plurality of clock signals, M being a positive integer greater than 3; and
a plurality of signal lines arranged to separately convey the clock signals received from the M bus lines, the plurality of signal lines comprising a plurality of adjacent signal-line pairs, each signal-line pair having a resistance difference, said signal lines comprising a maximum resistance value and a minimum resistance value, and wherein the M bus lines are arranged such that the resistance difference in any one of the adjacent signal-line pairs is smaller than a value difference between the maximum resistance value and the minimum resistance value.

DETAILED DESCRIPTION

Figure 1:
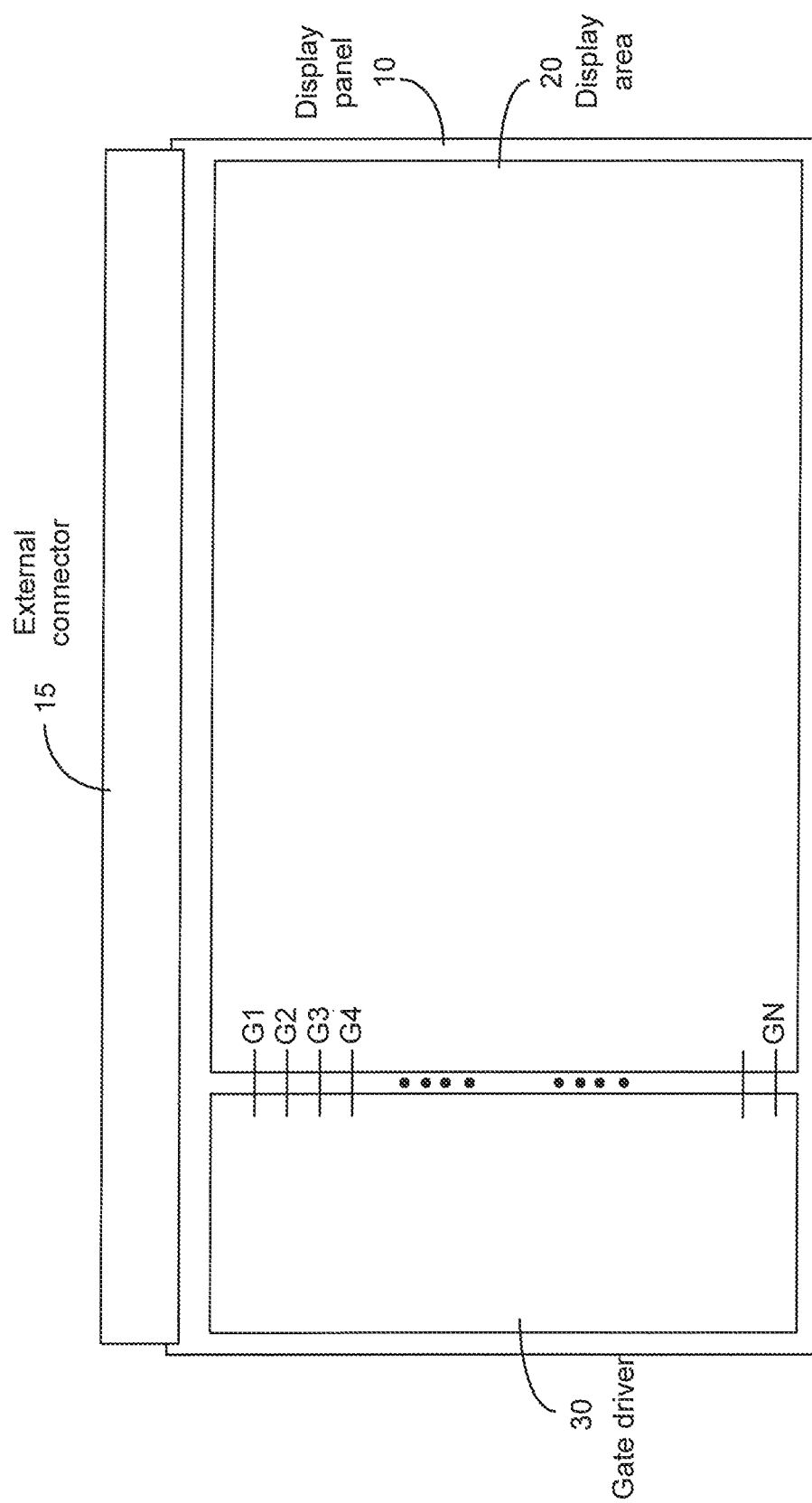
FIG. 1 shows a prior art display panel having a gate driver-on-array area adjacent to a display area.
Figure 2:
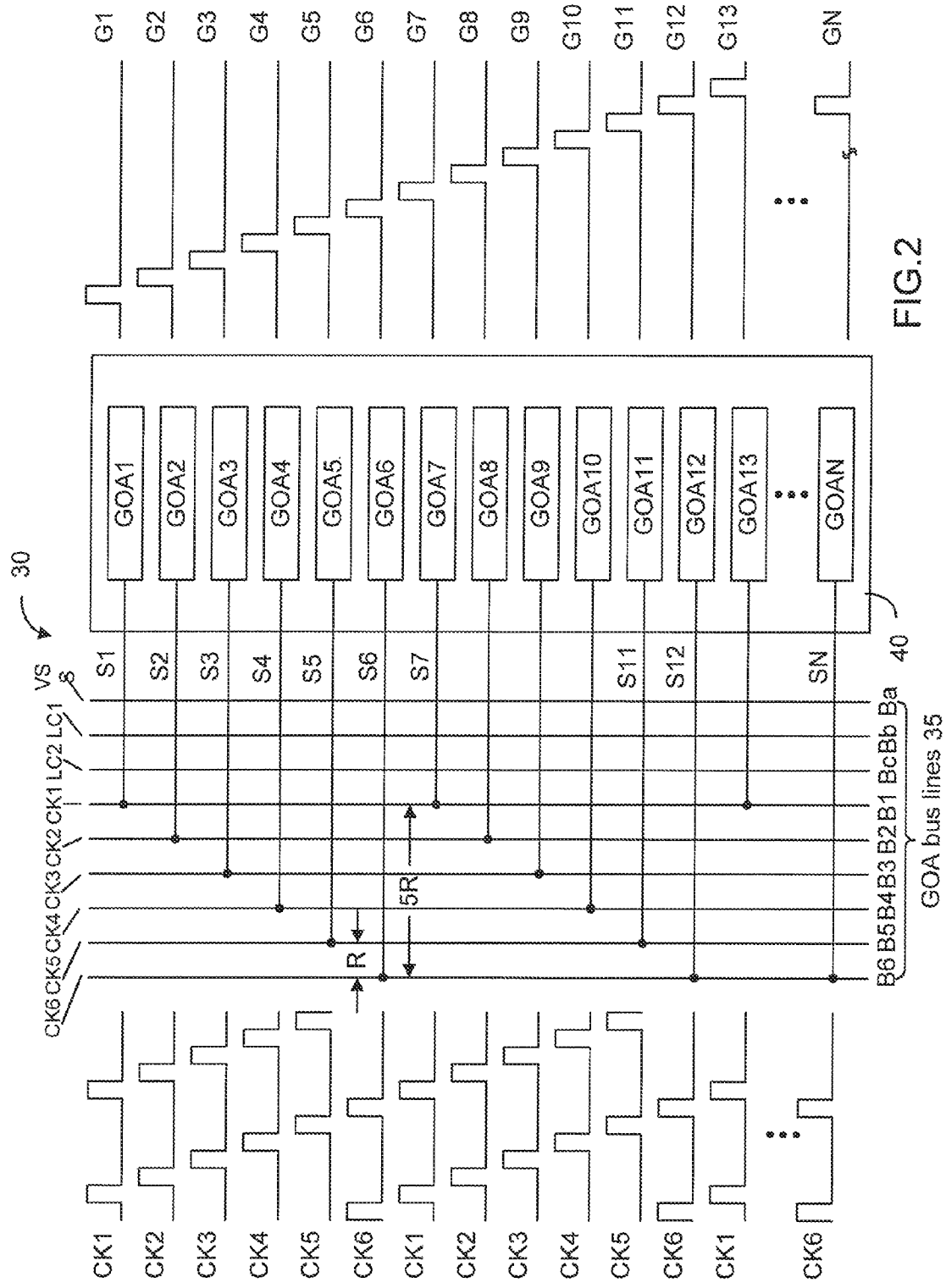
FIG. 2 shows an arrangement of bus lines, where the clock signals are provided to the gate driver circuit in an orderly fashion.

It is known in the art that the image on a display panel, such as an LCD panel, is composed of a plurality of pixels arranged in a two-dimensional array of columns and rows or lines. Each line of pixels is activated or charged by a gate signal provided by the gate-line driver on a gate line. In a gate driver that receives the clock signals from a different circuit or connector, such as the external connector 15 as shown in FIG. 1, a group of bus lines 35 is used to receive the clock signals from the external connector and provide the received clock signals to a gate driver circuit 40 as shown in FIG. 2. As shown in FIG. 2, the bus lines B6, B5, B4, B3, B2 and B1 are arranged in an orderly fashion to receive six clock signals CK6, CK5, CK4, CK3, CK2 and CK1. Other three bus lines Bc, Bb and Ba are used to receive two trigger signals LC2, LC1 and a voltage Vss. The received clock signals CK6, CK5, CK4, CK3, CK2 and CK1 are conveyed to a first group of driver circuits GOA1, GOA2, . . . , GOA6 on signal lines S1, S2, . . . , S6, a second group of driver circuits GOA7, GOA8, . . . , GOA12 on signal lines S7, S8, . . . , S12, and so forth.

The signal lines S1, S2, . . . , SN are typically made from an electrically conductive material which has electrical resistance. The electrical resistance is generally proportional to the length of the line. Since the signal lines S1, S2, . . . , S6 have different lengths, there will be resistance difference between any adjacent line-pair. If the resistance difference between S2 and S1 is R, then the resistance difference between S6 and S7 is approximately 5R. Due to the significant amount of the resistance difference between S6 and S7, the shape of gate signal pulse G6 and the shape of gate signal pulse G7 are significantly different. Likewise, the shape of gate signal pulse G12 and the shape of gate signal pulse G13 are similarly different. As shown in FIG. 2, the resistance differences between sequential adjacent signal-line pairs, starting from (S1, S2) are R, R, R, R, R, 5R, R, R, R, R, R, 5R, R, . . . , R. This means that the gate-line pulse shape changes appear repetitively for every group of six signal lines. As a result, a band pattern of bright and dark would appear on the display image. This band pattern could be an undesirable visual effect.

Figure 3:
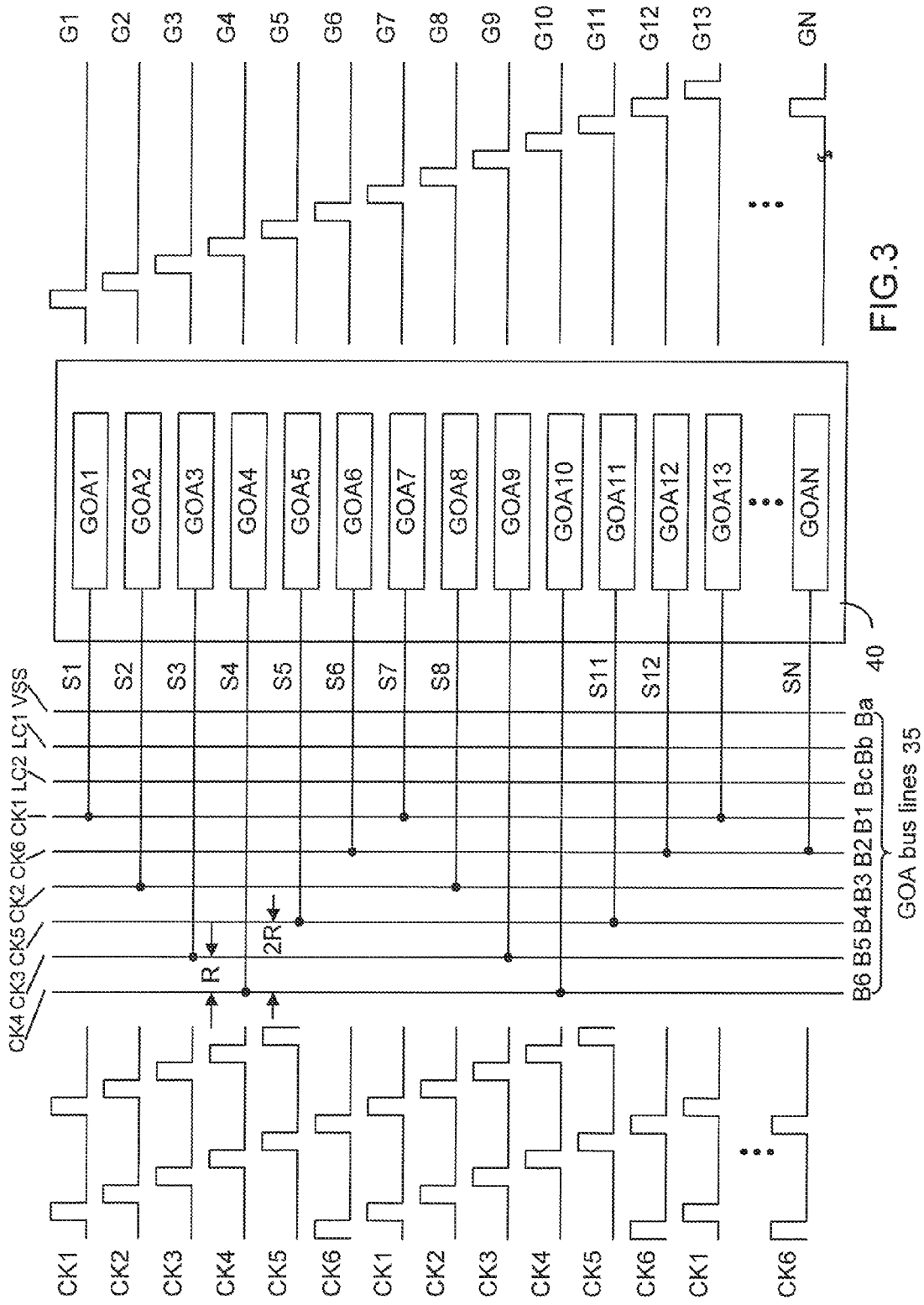
FIG. 3 shows an arrangement of bus lines, according to one embodiment of the present invention.
Figure 4:
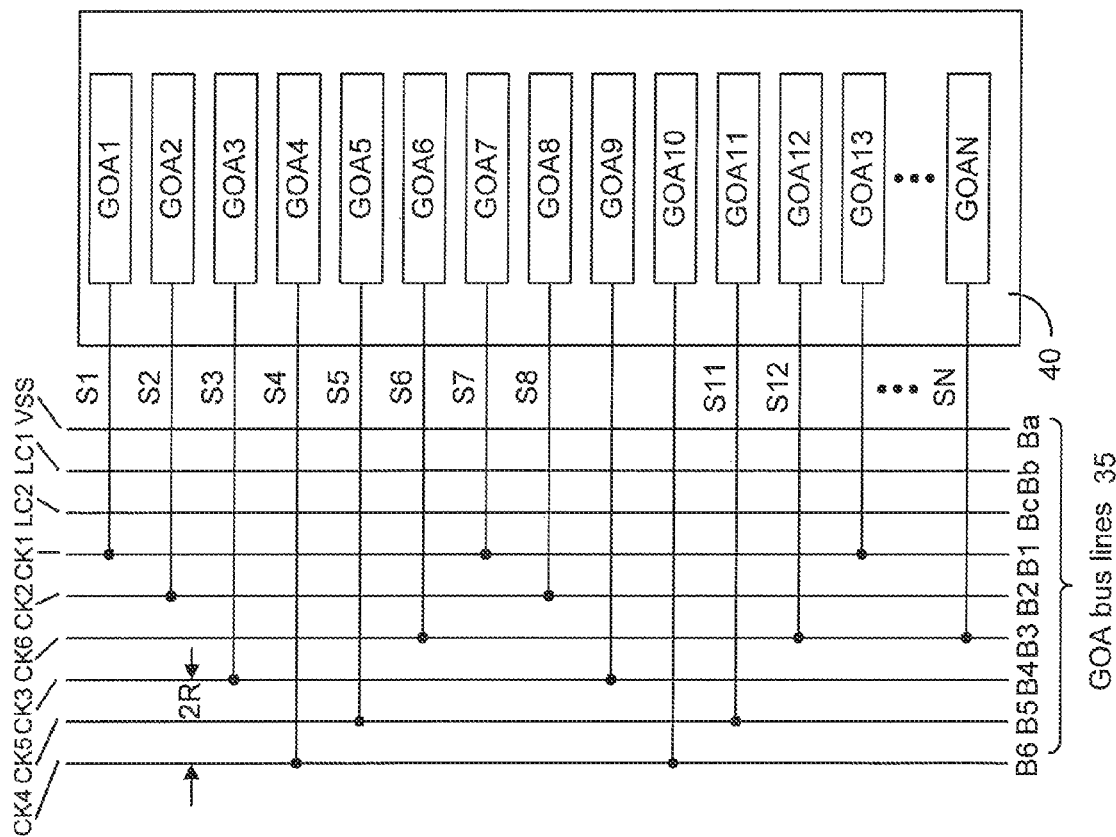
FIG. 4 shows an arrangement of bus lines, according to another embodiment of the present invention.

In various embodiments of the present invention, the arrangement of the bus lines in reference to the receiving of clock signals is changed so that largest resistance difference between two adjacent signal lines is reduced or minimized. In the embodiment as shown in FIG. 3, the bus lines B6, B5, B4, B3, B2 and B1 are arranged to receive the 6 clocks signals in the order of CK4, CK3, CK5, CK2, CK6 and CK1. As such, the largest resistance difference is 2R, occurring in the adjacent signal-line pairs (S1, S2), (S2, S3), (S4, S5) and (S5, S6). In the embodiment as shown in FIG. 4, the bus lines B6, B5, B4, B3, B2 and B1 are arranged to receive the 6 clocks signals in the order of CK4, CK5, CK3, CK6, CK2 and CK1. As such, the largest resistance difference is also 2R, occurring in the adjacent signal-line pairs (S2, S3), (S3, S4), (S5, S6) and (S6, S7). With six clock pulses, it is also possible to arrange the bus lines B6, B5, B4, B3, B2 and B1 to receive the clock signals in the order of CK1, CK2, CK6, CK3, CK5, CK4, or CK3, CK4, CK2, CK5, CK1, CK6, or CK6, CK1, CK5, CK2, CK4, CK3.

Figure 5:
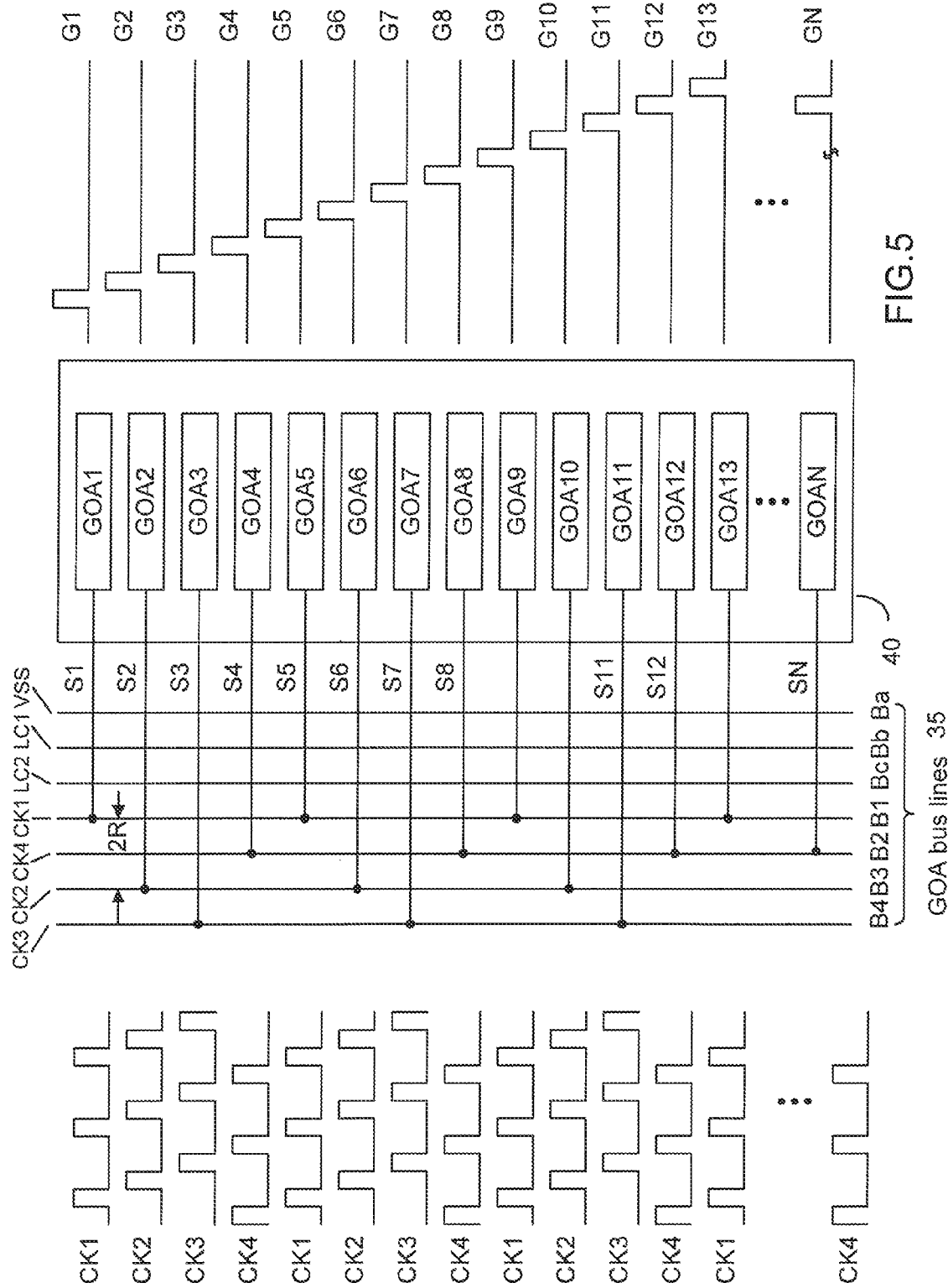
FIG. 5 shows an arrangement of bus lines, according to yet another embodiment of the present invention.

In the embodiment as shown in FIG. 5, the bus lines B4, B3, B2 and B1 are arranged to receive the 4 clocks signals in the order of CK3, CK2, CK4, CK1. As such, the largest resistance difference is 2R, occurring in the adjacent signal-line pairs (S1, S2) and (S3, S4).

Figure 6A:
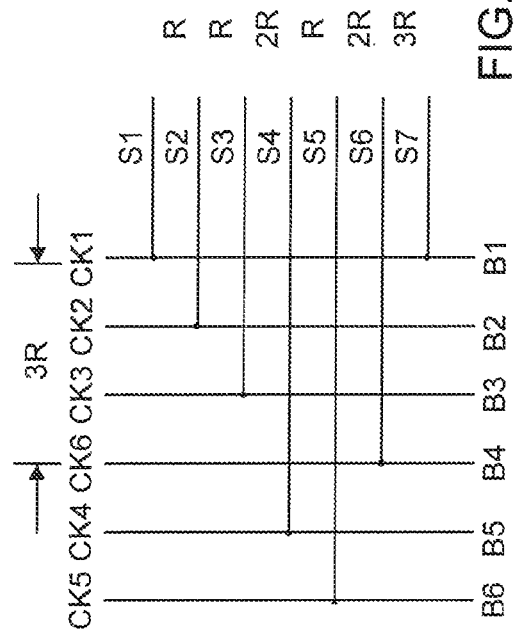
FIGS. 6a-6c show different arrangement of bus-lines, according to various embodiments of the present invention.

FIGS. 6a-7e illustrate the bus-line arrangement in a simpler way. FIG. 6a is a simplified version of the embodiment as show in FIG. 3. In this embodiment, the resistance difference between any adjacent signal-line pairs is either 2R or R. FIG. 6b illustrates the bus-line arrangement, according a different embodiment, the bus lines B6, B5, B4, B3, B2 and B1 are arranged to receive the 6 clocks signals in the order of CK5, CK4, CK6, CK3, CK2 and CK1, with the largest resistance difference being 3R. FIG. 6c also illustrates the bus-line arrangement wherein the largest resistance difference is 4R, which is still smaller than the resistance difference of 5R as shown in FIG. 2. As such, the undesirable visual effect resulting from the band pattern can be reduced or minimized.

Figure 7A:
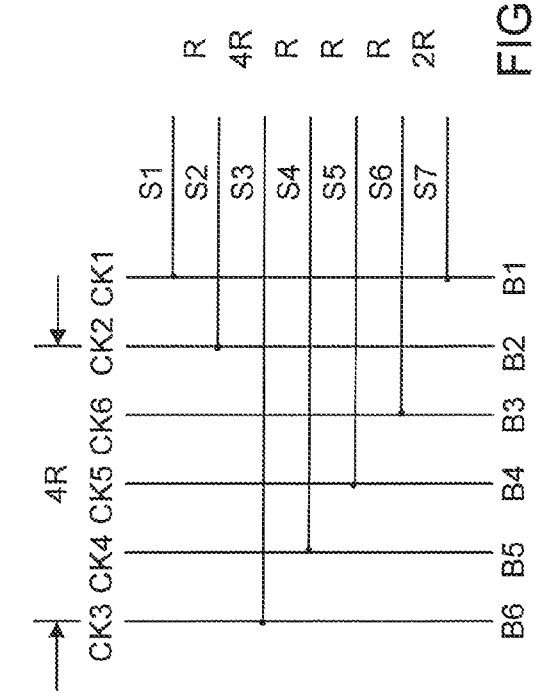
FIGS. 7a-7e show an arrangement of bus line, according to a different embodiment of the present invention.

FIG. 7a illustrates the arrangement of bus lines B8, B7, B6, B5, B4, B3, B2, B1 for receiving 8 clock pulses (M=8) in the order of CK5, CK4, CK6, CK3, CK7, CK2, CK8, CK1, wherein the largest resistance difference is 2R, and the resistance difference between any adjacent signal-line pairs (Sk, Sk+1) is either 2R or R. It is also possible to arrange the bus-line differently so that the largest resistance difference is 3R, 4R, 5R or 6R as shown in FIGS. 7b-7e.

Figure 7B:
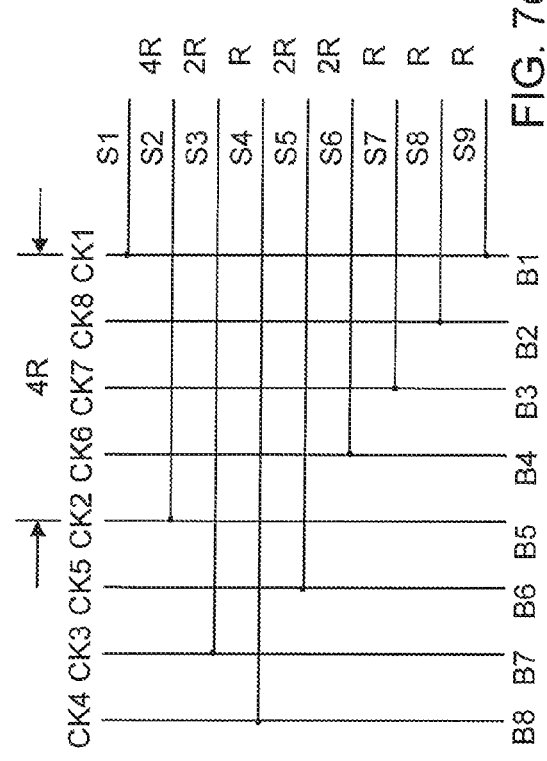
Figure 7C:
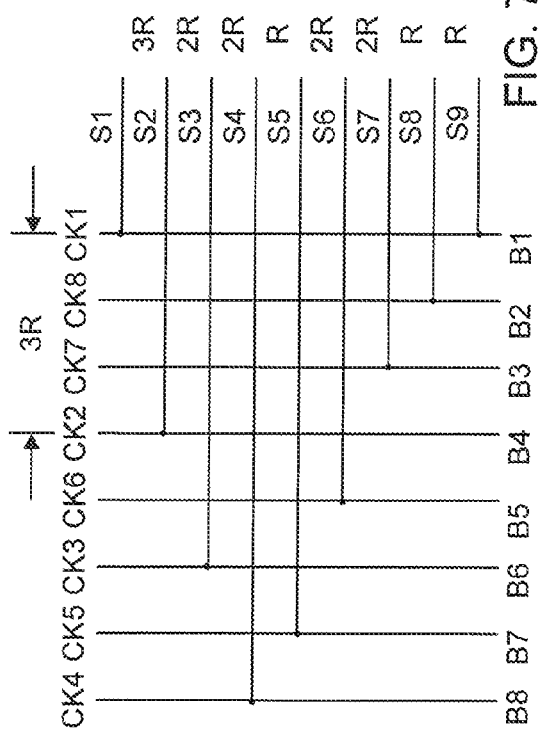
Figure 7D:
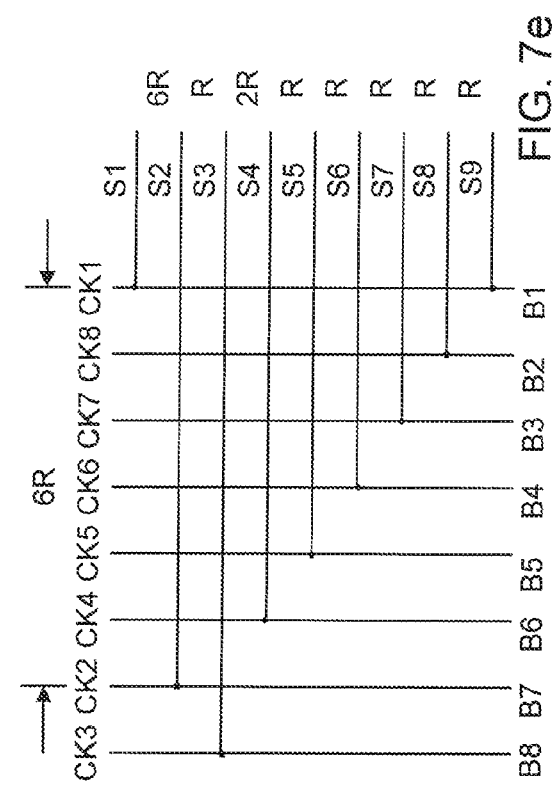
Figure 7E:
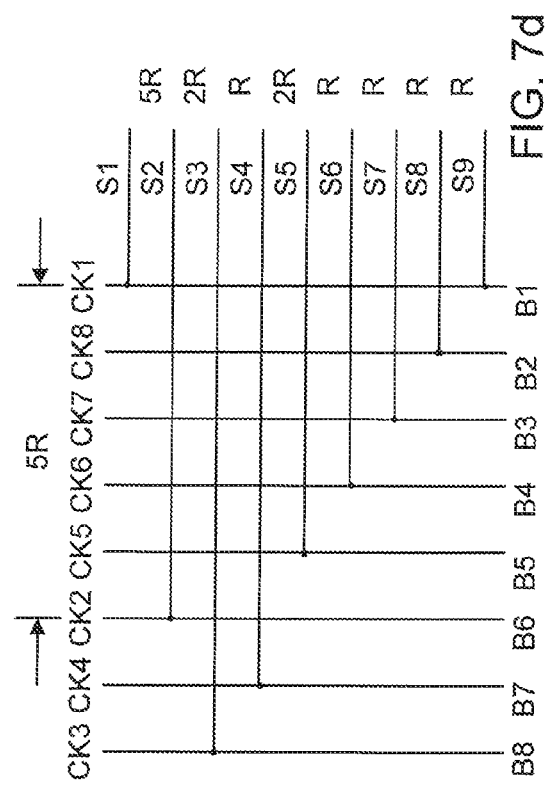

As shown in FIGS. 5, 6a and 7b, if the minimum resistance difference in a sequence of M adjacent signal-line pairs is R, then the order in which the clock signals are received can be arranged such that the resistance difference in any one of the adjacent signal-line pairs in the sequence is either R or 2R, regardless whether the number of bus lines, M, is 4, 6 or 8. So far as the present invention is concerned, the number of M, of bus-lines can also be 5, 7, 8, 9, 10, . . . 16, . . . or greater.

It can be seen from FIGS. 2-7e, the resistance difference between two adjacent signal lines is determined by the bus lines receiving the clock signals. For example, in FIG. 3, the adjacent signal lines S3, S4 are used to provide clock signals CK3, CK4 to the gate driver circuit 40 and the clock signals CK3 and CK4 are received in bus lines B6 and B5. Since B6 and B5 are adjacent bus lines, the resistance difference between signal lines S3 and S4 is minimum which is denoted as R. The adjacent signal lines S1, S2 are used to provide clock signals CK1, CK2 to the gate driver circuit 40 and the clock signals CK1 and CK2 are received in bus lines B1 and B3. Since B1 and B3 are separated by B2, the resistance difference between S2 and S1 is 2R. In the arrangement as shown in FIG. 2, the adjacent signal lines S6, S7 are used to provide clock signals CK6 and CK1 to the gate driver circuit 40 and the clock signals CK6 and CK1 are received in bus lines B6 and B1. Since B6 and B1 are separated by B5, B4, B3 and B2, the resistance difference between S6 and S7 is 5R. If the electrical resistance in signal line S6 has a maximum resistance value, and the electrical resistance in signal line S7 has a minimum resistance value, then 5R, in this particular case, is the difference between the maximum resistance value and the minimum resistance value.

Thus, according to various embodiments of the present invention, when there are M bus lines in the bus area for receiving a plurality of clock signals (CK1-CKM), M being a positive integer greater than 3, and a group of signal lines (S1-SM) or (SM+1-SM+M), . . . is used to separately provide the clock signals from the M bus line to the gate driver circuit. The gate driver circuit is configured to provide the plurality of sequential gate line signals in response to the clock signals, wherein the plurality of signal lines comprises a plurality of adjacent signal-line pairs, each signal line pair having a resistance difference (pR), said signal lines comprising a maximum resistance value and a minimum resistance value, and wherein the M bus lines are arranged such that the resistance difference (pR) in any one of the adjacent signal-line pairs is smaller than a value difference ([M−1]R) between the maximum resistance value and the minimum resistance value. Here the integer p is in the range of 1 to (M−2).

Figure 6C:
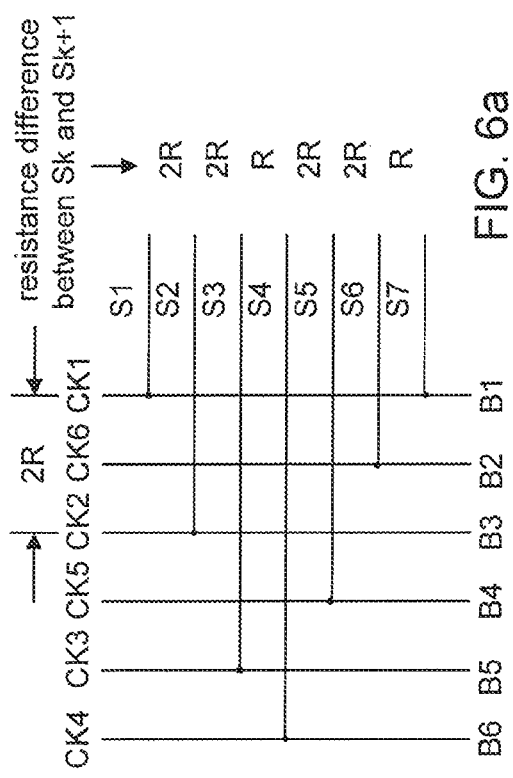
Figure 6B:
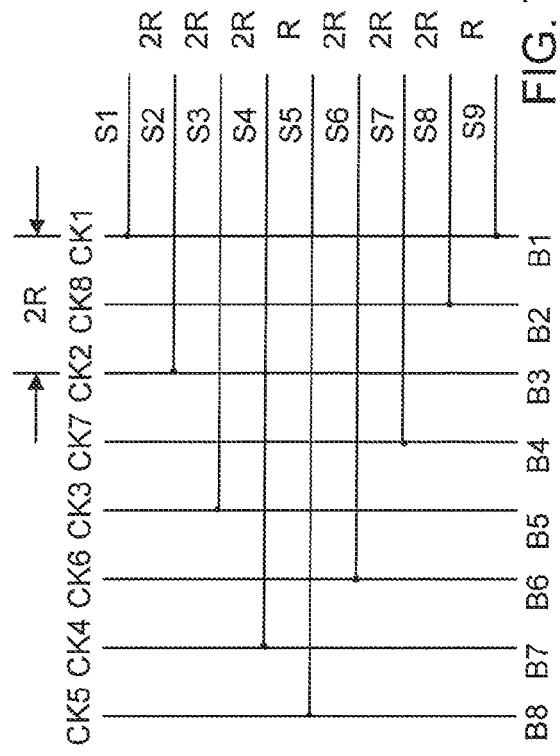

As mentioned earlier, when the resistance differences in a sequence of adjacent signal-line pairs (with M=6), starting from (S1, S2) are R, R, R, R, R, 5R, R, R, R, R, R, 5R, R, . . . , R, a band pattern of bright and dark would appear on the display image. The band pattern repeats every six signal lines. With the method of bus-line arrangement, according to various embodiments of the present invention, not only the largest resistance difference is reduced, but the resistance differences among the adjacent signal-line pairs are also spread out. For example, in the embodiment as shown in FIGS. 3 and 6a, the resistance differences in a sequence of adjacent signal-line pairs (with M=6), starting from (S1, S2) are 2R, 2R, R, 2R, 2R, R, 2R, 2R, R, 2R, 2R, R, . . . , 2R. In the embodiment as shown in FIG. 6c, the resistance differences in the sequence of sequential adjacent signal-line pairs (M=6), starting from (S1, S2) are R, 4R, R, R, R, 2R, R, 4R, R, R, R, 2R, . . . , 2R. Thus, although some resistance-difference change occurs at the line pairs (S2, S3), (S8, S9), (S14, S15) and so on, lesser changes also occur at the line pairs (S6, S7), (S12, S13), . . . . As a result, the band pattern of bright and dark is less noticeable.

In summary, in various embodiments of the present invention, when M is 4 or larger, and the minimum resistance difference in a sequence of M adjacent signal-line pairs is R, then the order in which the clock signals are received can be arranged such that the resistance difference in any one of the adjacent signal-line pairs in the sequence is either R or 2R. When M is a larger number such is 8, then the order in which the clock signals are received can be arranged such that the maximum resistance difference is 3R, 4R, 5R or 6R. In general, the maximum resistance difference can be 3R, 4R, . . . , kR, where k=M−2.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for use in a display panel (10) comprising a display area (20) and a signal area (30), the display area configured to receive a plurality of sequential gate line signals (G1-GN) from the signal area for controlling the display area in a frame time, the signal area comprising a bus area (35) and a circuit area (40), said method comprising:

providing M bus lines in the bus area for receiving a plurality of clock signals (CK1-CKM), M being a positive integer greater than 3;

providing a plurality of signal lines (S1-SN) to separately provide the clock signals from the M bus line to the circuit area, the circuit area configured to provide the plurality of sequential gate line signals in response to the clock signals, the plurality of signal lines comprising a plurality of adjacent signal-line pairs (sk, sk+1), each adjacent signal-line pair having a resistance difference (pR), said signal lines comprising a maximum resistance value and a minimum resistance value, and wherein the M bus lines are arranged such that the resistance difference (pR) in any one of the adjacent signal-line pairs is smaller than a value difference ([M−1]R) between the maximum resistance value and the minimum resistance value.

2. The method according to claim 1, wherein a minimum resistance difference in a sequence of M adjacent signal-line pairs is R, and the resistance difference in any one of the adjacent signal-line pairs in the sequence is either R or 2R.

3. The method according to claim 1, wherein M=6, and wherein a minimum resistance difference in a sequence of M adjacent signal-line pairs is R, and a maximum resistance difference in the sequence is 3R or 4R.

4. The method according to claim 1, wherein M=8, and wherein a minimum resistance difference in a sequence of adjacent signal-line pairs is R, and a maximum resistance difference in the sequence is 3R, 4R, 5R or 6R.

5. The method according to claim 1, wherein the display panel comprises a substrate, and wherein the display area is located at a first part of the substrate and the signal area is located at a second part of the substrate, and wherein the circuit area is located between the bus area and the display area, and wherein the bus lines are arranged to receive the plurality of clock signals from an external connected disposed on an edge of the substrate.

6. The method according to claim 5, wherein the bus lines are arranged in parallel in a first direction, and the signal lines are arranged in parallel in a different second direction.

7. The method according to claim 6, wherein the bus lines are separated from each other by a substantially equal gap.

8. A circuit (30) comprising:
a bus area (35) comprising M bus lines configured to receive a plurality of clock signals, M being a positive integer greater than 3; and
a plurality of signal lines arranged to separately convey the clock signals received from the M bus lines, said plurality of signal lines comprising a plurality of adjacent signal-line pairs, each signal-line pair having a resistance difference, said signal lines comprising a maximum resistance value and a minimum resistance value, and wherein the M bus lines are arranged such that the resistance difference in any one of the adjacent signal-line pairs is smaller than a value difference between the maximum resistance value and the minimum resistance value.

9. The circuit according to claim 8, further comprising
a gate driver (40) configured to provide a plurality of sequential gate signals to a display area in a frame time, wherein the plurality of signal lines arranged to separately convey the clock signals received from the M bus lines to the gate driver, wherein the plurality of sequential gate signals are provided in response to the clock signals.

10. The circuit according to claim 8, wherein a minimum resistance difference in a sequence of M adjacent signal-line pairs is R, and the resistance difference in any one of the adjacent signal-line pairs in the sequence is either R or 2R.

11. The circuit according to claim 8, wherein M=6, and wherein a minimum resistance difference in a sequence of M adjacent signal-line pairs is R, and a maximum resistance difference in the sequence is 3R or 4R.

12. The circuit according to claim 8, wherein M=8, and wherein a minimum resistance difference in a sequence of adjacent signal-line pairs is R, and a maximum resistance difference in the sequence is 3R, 4R, 5R or 6R.

13. A display panel, comprising:
a display area comprising an array of pixels;
a gate driver configured to provide a plurality of sequential gate signals to the display area for controlling the array of pixels in a frame time;
a bus area comprising M bus lines configured to receive a plurality of clock signals, M being a positive integer greater than 3, and a plurality of signal lines arranged to separately provide the clock signals from the M bus lines to the gate driver, wherein the plurality of sequential gate signals are provided in response to the clock signals, said plurality of signal lines comprising a plurality of adjacent signal-line pairs, each signal-line pair having a resistance difference, said signal lines comprising a maximum resistance value and a minimum resistance value, and wherein the bus lines are arranged such that the resistance difference in any one of the adjacent signal-line pairs is smaller than a value difference between the maximum resistance value and the minimum resistance value.

14. The display panel according to claim 13, wherein a minimum resistance difference in a sequence of M adjacent signal-line pairs is R, and the resistance difference in any one of the adjacent signal-line pairs in the sequence is either R or 2R.

15. The display panel according to claim 13, wherein M=6, and wherein a minimum resistance difference in a sequence of M adjacent signal-line pairs is R, and a maximum resistance difference in the sequence is 3R or 4R.

16. The display panel according to claim 13, wherein M=8, and wherein a minimum resistance difference in a sequence of adjacent signal-line pairs is R, and a maximum resistance difference in the sequence is 3R, 4R, 5R or 6R.

17. The display panel according to claim 13, further comprising a substrate, and wherein the display area is located at a first part of the substrate, the bus area is located at a second part of the substrate, and the gate drive is disposed between the bus area and the display area, and wherein the bus lines are arranged to receive the plurality of clock signals from an external connected disposed on an edge of the substrate.

18. The display panel according to claim 17, wherein the bus lines are arranged in parallel in a first direction, and the signal lines are arranged in parallel in a different second direction.

19. The display panel according to claim 18, wherein the bus lines are separated from each other by a substantially equal gap.

* * * * *